United States Patent [19]

Hungerford

[11] 4,204,257

[45] May 20, 1980

[54] NUMERICAL CONTROL RESOLVER POSITION MEASURING DEVICE

[75] Inventor: William R. Hungerford, Detroit, Mich.

[73] Assignee: The Bendix Corporation, Southfield, Mich.

[21] Appl. No.: 964,226

[22] Filed: Nov. 28, 1978

[51] Int. Cl.$^2$ .................. G06F 15/46; H03K 13/02
[52] U.S. Cl. ............................. 364/474; 318/661; 340/347 SY; 364/603
[58] Field of Search ............. 364/107, 474, 603, 729, 364/730, 815, 817, 118; 340/347 SY; 235/92 MP; 318/661, 608, 569, 570, 574, 600

[56] References Cited

U.S. PATENT DOCUMENTS

| | | | |
|---|---|---|---|
| 3,078,400 | 2/1963 | Kilroy et al. | 318/661 |
| 3,634,838 | 1/1972 | Granquist | 340/347 SY X |
| 3,673,585 | 6/1972 | Tripp et al. | 340/347 SY X |
| 3,676,650 | 7/1972 | Henegar | 340/347 SY X |
| 3,701,888 | 10/1972 | McDaniel | 364/118 |
| 3,866,212 | 2/1975 | Simon et al. | 318/661 X |
| 3,878,535 | 4/1975 | Twiss | 340/347 SY |
| 3,918,045 | 11/1975 | Morser et al. | 340/347 SY |
| 4,010,463 | 3/1977 | Kay | 340/347 SY |

Primary Examiner—Joseph F. Ruggiero

Attorney, Agent, or Firm—Robert L. Kaner; Markell Seitzman; Russel C. Wells

[57] ABSTRACT

An absolute resolver position measuring device for a numerical control apparatus that controls a machine having a plurality of movable members. A resolver is operatively connected to each movable member such that the rotor of each resolver rotates as the corresponding member moves. The resolver position measuring device includes a real time counter that provides a multi-digit data word that is cyclically redundant. A first PROM is addressed by the real time counter and provides a sequence of digital data words which represent a sine waveform; and a second PROM is addressed by the real time counter and provides a sequence of digital data words which represent a cosine waveform. A first digital to analog converter is responsive to the first PROM to provide a sine wave to the first stator winding of each resolver, and a second digital to analog converter is responsive to the second PROM to provide a cosine wave to the second stator winding of each resolver. The waveform induced in each resolver rotor is input to a zero crossing detector and the outputs of the zero crossing detectors are multiplexed in a sequential order onto a single conductor. This multiplexed signal is used to store the current count of the real time counter a plurality of times such that the stored counts represent the phase angles between the corresponding resolver stator windings and rotors.

14 Claims, 7 Drawing Figures

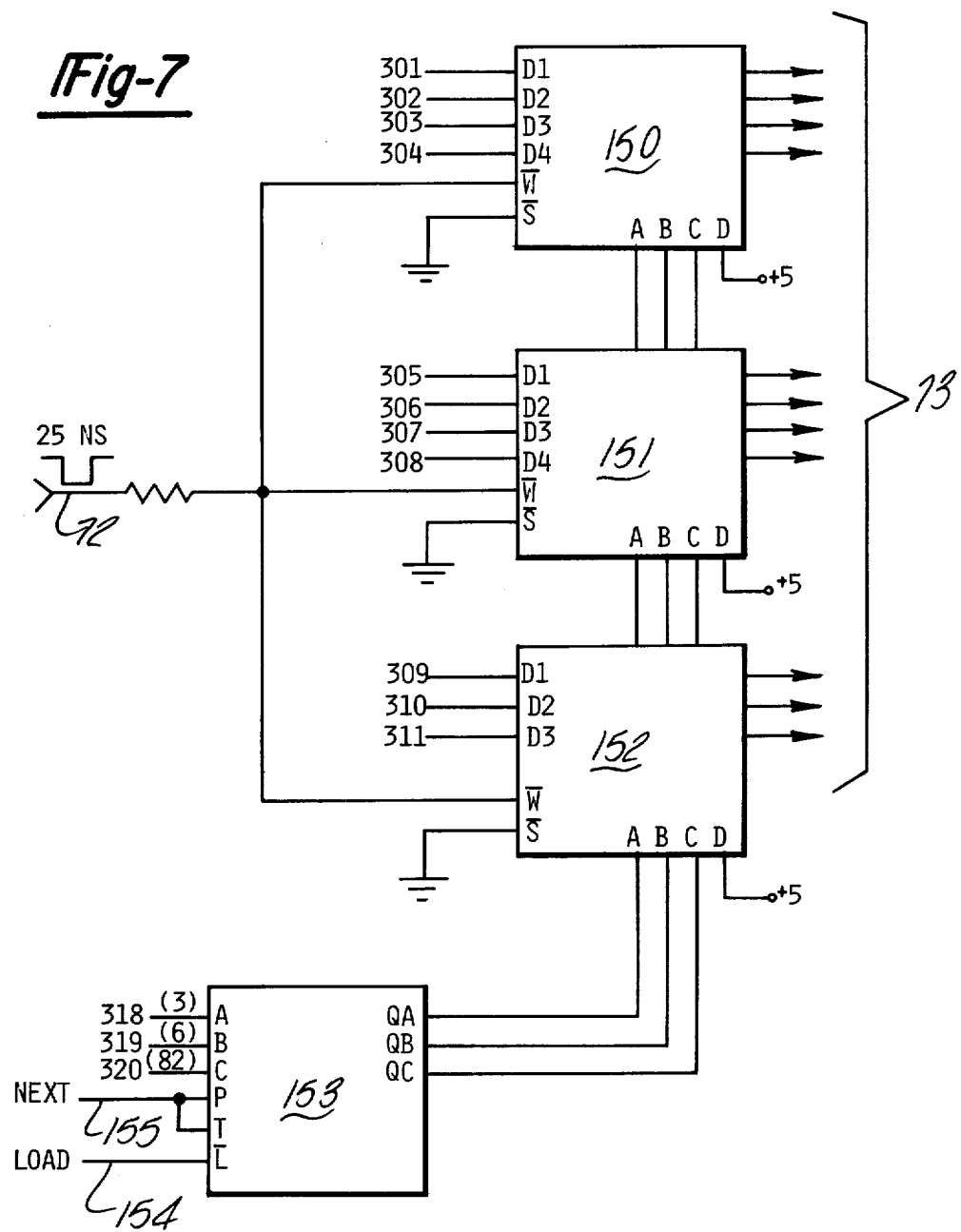

NUMERICAL CONTROL RESOLVER POSITION MEASURING DEVICE

BACKGROUND

1. Field of the Invention

This invention relates to numerical control systems for machines having movable members controlled by servosystems and more particularly to a resolver position measuring device in such a system for indicating the position of a movable member.

2. Description of the Prior Art

Numerical control systems control machines, such as milling and boring machines, lathes and the like wherein the machines have movable members that are moved by servosystems under the control of the numerical control system. The numerical control system typically commands movement of a member of the machine, measures the position of the member and then revises its command of the member in closed loop fashion. Often, numerical control systems control multiple axes of a machine in time coordinated fashion. The position of the movable member is typically measured using a resolver wherein quadrature excitation signals are applied to the stators of the resolver, the rotor of the resolver is operably connected to the movable member, and the waveform out of the rotatable rotor of the resolver is analyzed.

Such a resolver position measuring device for a numerical control system must be relatively inexpensive and capable of making numerous rapid, accurate, and reliable measurements while operating in a relatively hostile environment. For example, a typical numerical control system may require greater than 150 resolver position measurements per second on a resolver whose rotor may be revolving at a velocity of greater than 40,000 degrees per second. A high measurement rate is desirable because it is desirable to make a measurement less than every one-half revolution of the rotor when operating at maximum velocity of the movable member such that the direction of motion and absolute position can be kept track of by the electronics. Accurate measurements are desirable to provide precision machine movement and closed loop feedback control. Typically, the numerical control apparatus and the resolver position measuring device must operate with proper speed and accuracy in a machine-shoptype environment in which the ambient temperature can vary in an unpredictable manner.

U.S. Pat. No. 3,634,838 issued to Granqvist shows a resolver position measuring device that utilizes two counters and a resolver having three stator windings. The first counter generates a reference 400 Hz square wave which is filtered and then phase shifted to provide first and second sinusoidal stator winding excitations. The third stator winding detects the phase of at least one of the applied signals; and a phase detector compares the phase of the third stator winding to the phase of the second counter and activates circuitry to increase or decrease pulses to the first counter to maintain the third stator winding in phase with the second counter. A phase responsive device detects the zero crossing of the induced rotor waveform and utilizes it to transfer the count of the second counter to a storage device. As a practical matter, however, the implementation of such a closed loop phase compensating scheme may be relatively complex and expensive.

Another known resolver position measuring device applies quandrature square waves to the resolver's two stator windings. The waveform induced in the rotor is then filtered to pass the fundamental frequency and eliminate the higher order harmonics. A phase comparison loop compares the phase of this fundamental frequency to the phases of the square wave stator excitation and provides a count indicative of the phase difference. As a practical matter, however, an accurate temperature-compensated filter for such a resolver position measuring device is rather expensive.

SUMMARY OF THE INVENTION

The present invention provides an accurate and inexpensive resolver position measuring device for a numerical control system.

A position measuring device according to the present invention operates in conjunction with a resolver having a pair of stator windings and a rotor with the rotor being operatively connected to a movable member of the machine that is being numerically controlled. The position measuring device includes a real time counter means that counts real time and provides a multi-digit digital data word that is cyclically redundant with time. A memory storage means is addressed by the cyclic digital data word of the real time counter means and in turn provides sequences of digital data words which represent quadrature sinusoidal waveforms. A first digital to analog converter means is responsive to the digital data from the memory means and in turn provides an approximately sinusoidal waveform to energize the first stator winding of the resolver. A second digital to analog converter means is responsive to digital data from the memory means and in turn provides a second approximately sinusoidal waveform to energize the second stator winding of the resolver with the outputs of the first and second digital to analog converter means being in a quadrature relationship. The resolver rotor, which is operatively connected to the machine's movable member, provides a waveform to a phase detecting means that in turn indicates when the waveform from the resolver's rotor reaches a predetermined phase relationship. The output indication of the phase detecting means transfers the current time from the real time counter means to a storage means such that the contents of the storage means represents the position of the rotor with respect to the stator windings.

In the preferred embodiment, a free-running real time counter counts a precise, high frequency clock and provides a multi-digit data word that is cyclically redundant. A first PROM is addressed by the real time counter and provides a sequence of digital data words which represent a sine waveform; and a second PROM is addressed by the real time counter in parallel with the first PROM and provides a sequence of digital data words which represent a cosine waveform. A first digital to analog converter is responsive to the first PROM to provide a cyclically redundant sine wave to the first stator winding of the resolver, and a second digital to analog converter is responsive to the second PROM to provide a cyclically redundant cosine wave to the second stator winding of the resolver. The digital to analog converters provide outputs that maintain a precise phase relationship with the real time counter. The waveform induced in the resolver rotor is filtered at a frequency significantly above the fundamental frequency and the approximate zero crossing of this waveform is used to store the current count of the real time counter. Such count represents the phase angle between the stator windings and the rotor of the resolver.

The accuracy of measurements utilizing the present invention is not significantly affected by the temperature changes that commonly occur in the numerical control environment. Because there are no filters or phase shifters in either the stator or rotor circuitry which operate at the fundamental frequency of excitation, temperature induced phase shifts cannot significantly affect the accuracy of the measurements. The filtering in the rotor buffer amplifier of the preferred embodiment provides a smoothing function at a frequency significantly above the fundamental frequency such that temperature effects at these higher frequencies do not significantly affect the accuracy at the fundamental frequency.

The position measuring device of the preferred embodiment is accurate and inexpensive as required for a numerical control environment because it utilizes medium and large scale digital integrated circuits and minimizes the utilization of analog circuitry which has inherent offset, calibration and phase shift problems. The present invention economically provides precise magnitude and phase excitation to both of the resolver's stators.

The position measuring device can make measurements at a high rate of speed as required for the numerical control environment because the measurements are essentially digital and can be repeated if desired on every cycle of the funadmental frequency of excitation. There is no waiting for analog loops to stabilize.

The position measuring device measures the absolute position within any given revolution of the resolver such that a slight inaccuracy in any given measurement due to environmental noise pickup is non-cumulative (automatically corrected) when the next measurement is taken.

BRIEF DESCRIPTION OF THE DRAWINGS

FIG. 7 shows a more detailed implementation for the storage block of FIG. 2.

DETAILED DESCRIPTION OF THE INVENTION

Figure 1:
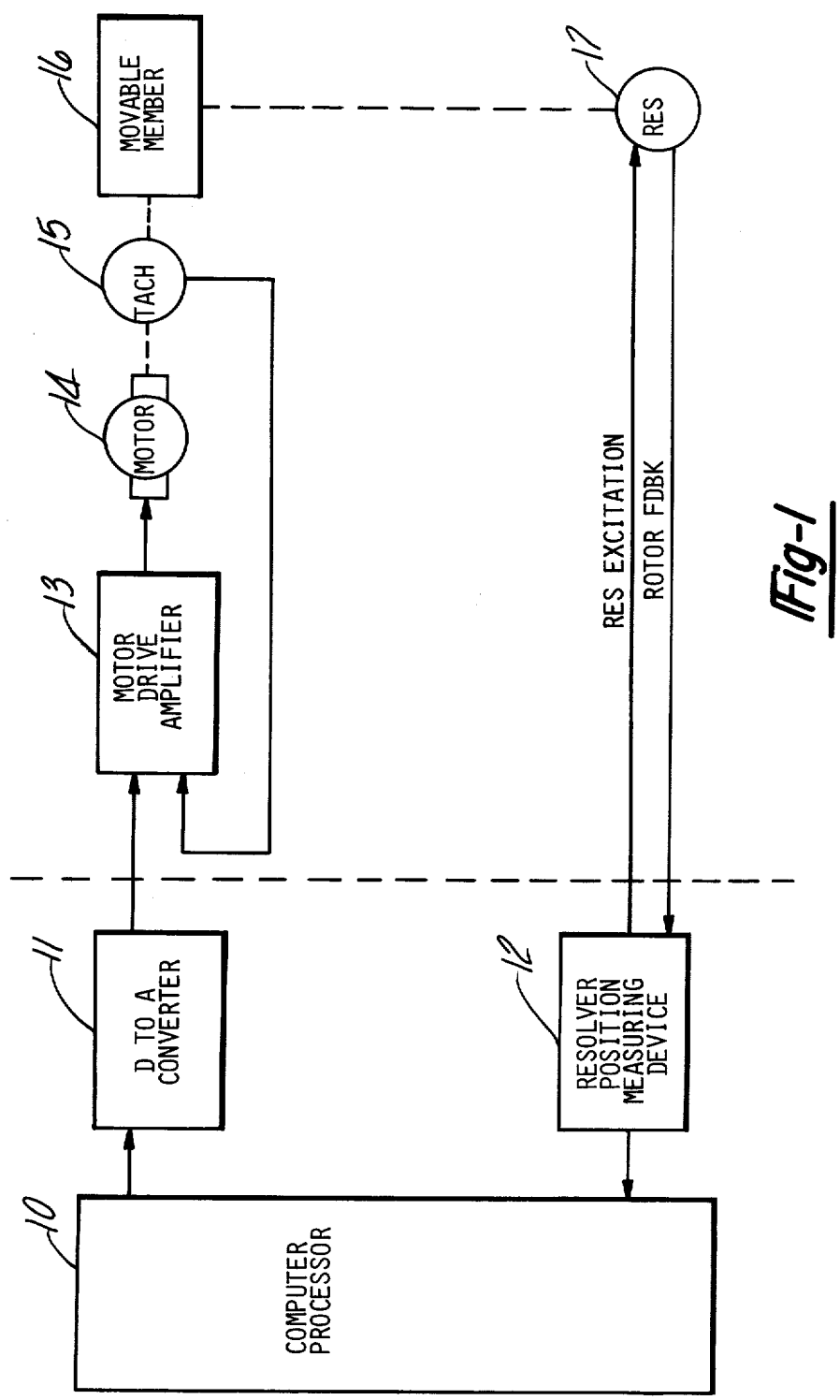
FIG. 1 shows a general block diagram of a numerical control apparatus that controls a machine having a movable member wherein the numerical control apparatus includes a resolver position measuring device.

FIG. 1 shows a block diagram of a typical numerical control apparatus controlling a machine tool having a movable member. The numerical control apparatus may, for example, include a computer processor 10, a digital to analog converter 11 and a resolver position measuring device 12. The machine tool may, for example, include a motor drive amplifier 13, a motor 14, a tachometer 15, a movable member 16 and a resolver 17.

Such a numerical control apparatus may control a machine tool in a closed loop fashion as follows. Data indicating the desired machine movement may be input to the computer processor 10 from paper tape or other media. The processor 10 in response to data may output a digital velocity command to digital to analog converter block 11. Block 11 in turn provides an analog velocity command to the machine tool motor drive amplifier 13. The amplifier 13 responds to this velocity command and energizes the motor 14. The tachometer 15 is mechanically linked to the motor and provides feedback to the amplifier 13 such that the motor approximately tracks the velocity command. Mechanically linked to the motor 14 is the driven member 16; and the resolver 17 is operatively linked to the driven member 16 such that the resolver rotor rotates as the member moves. The resolver position measuring device 12 supplies quadrature resolver excitation signals to the resolver's stators, monitors the waveform induced in the resolver's rotor, and determines the rotational position of the rotor with respect to the stators within any given revolution of the rotor. Block 12 supplies this actual position information to the processor 10. The processor 10 may then compare this actual position information (versus time) to the desired position (versus time) and appropriately update the command to block 11 in closed loop fashion.

Figure 2:
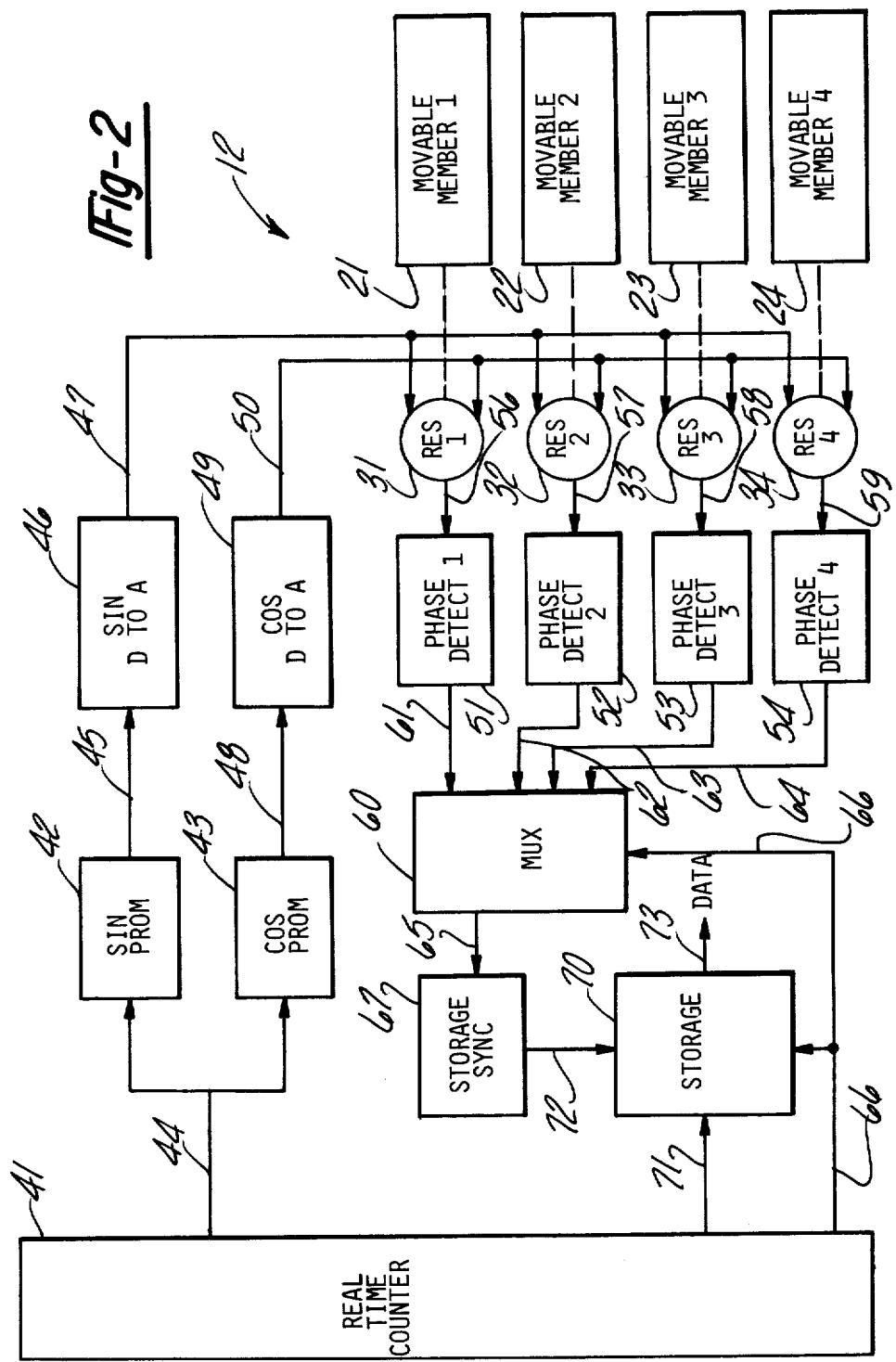
FIG. 2 shows a detailed block diagram of an absolute resolver position measuring device according to the present invention which may be used for the position measuring device of FIG. 1.

FIG. 2 shows a detailed block diagram of an absolute resolver position measuring device according to the present invention. Such position measuring device may be used for the position measuring device 12 of FIG. 1. The position measuring device of FIG. 2 is designed to operate with a machine having four movable members, designated 21 through 24, which members correspond to separable axes of motion. Each movable member 21 through 24 is operably linked, respectively, to a corresponding resolver rotor, designated 31 through 34. The circuitry of FIG. 2 measures the position of each resolver utilizing a multiplexing technique such that common circuitry can be shared.

A real time counter 41 counts an accurate 8 MHz clock and provides an accurate real time base for the position measuring device. The real time counter cyclically counts 2,000 of such clock pulses and provides an 11 bit parallel output indicative of the current count. Such 2,000 counts correspond to a period of 250 microseconds or a fundamental frequency of excitation of 4 KHz. The counter 41 also provides lower frequency counting which is used to steer the multiplexing function as more fully explained later.

Sine PROM 42 and Cosine PROM 43 are addressed via path 44 by the most significant 5 bits of the 11 bit parallel cyclically redundant output of counter 41. Such 5 bits are cyclically redundant at the fundamental frequency of 4 KHz and address 32 locations in each PROM.

In response to such addressing, sine PROM 42 outputs a sequence of 32 discrete data words (each 8 bits parallel) on path 45 which sequence represents a sinusoidal waveform at the fundamental frequency. The data words on path 45 are input to Sine digital to analog converter 46 which converts the sequence of 32 cyclic data words to a single analog voltage on conductor 47 that approximates a sinusoidal waveform. Such waveform has a precise phase relationship to real time counter 41 and is applied to a first stator winding of each of the resolvers 31 through 34.

Cosine PROM 43, in response to its addressing on path 44, outputs a sequence of 32 discrete data words (each 8 bits parallel) on path 48, which sequence represents a sinusoidal waveform at the fundamental frequency with such waveform being quadrature to that on path 45. The data words on path 48 are input to Cosine digital to analog converter 49 which converts the sequence of 32 data words to a single analog voltage on conductor 50 that approximates a sinusoidal waveform. Such waveform on conductor 50 has a precise phase relationship to real time counter 41 and hence a precise quadrature relationship (90 degree phase shift) to the waveform on conductor 47. The cosine waveform on conductor 50 is applied to a second stator winding of each of the resolvers 31 through 34.

The rotor of each of the resolvers 31 through 34 is mechanically linked to a respective one of the members 21 through 24 such that each resolver's rotor rotates as the corresponding member moves. An appropriate waveform is induced in each rotor based upon its rotational position. The waveforms out of the rotors of resolvers 31 through 34 are respectively input to phase detectors 51 through 54 via conductors 56 through 59.

Each phase detector 51 through 54 detects the zero crossing of the waveform in a positive to negative direction. Such phase detectors include lock out circuitry such that only one output pulse is provided in response to the first positive to negative zero crossing during each cycle. The output pulses from phase detectors 51 through 54 are input to multiplexer 60 via conductors 61 through 64 respectively.

Multiplexer 60 selects one of the four signals on conductors 61 through 64 and places it on conductor 65 based upon address information input to the multiplexer on path 66. Each of the inputs 61 through 64 is selected every 6 milliseconds. The address information on path 66 is provided by outputs of the real time counter 41 which are of lower frequency than the 4 KHz fundamental frequency. The output of multiplexer 60 on conductor 65 is input to storage synchronizer 67.

Storage block 70 stores the current 11 bit parallel output of the real time counter 41 on path 71 in response to a store pulse on conductor 72. Storage 70 is provided by multi-register storage with the particular register being selected by address information on path 66. The multiplexer 60 and storage 70 are addressed by the same data on path 66 such that the times of the zero crossing of a given resolver are always stored in the same registers within the storage 70. The storage 70 can also be addressed separately to output the stored data onto path 73.

Storage synchronizer block 67 accepts the asynchronous zero crossing signal on conductor 65 and in turn supplies a storage pulse on conductor 72 that is synchronized and phased to the real time counter means 41. Thus, the storage pulse on conductor 72 is always provided when the 11 bit parallel data on path 71 is stable.

Figure 3:
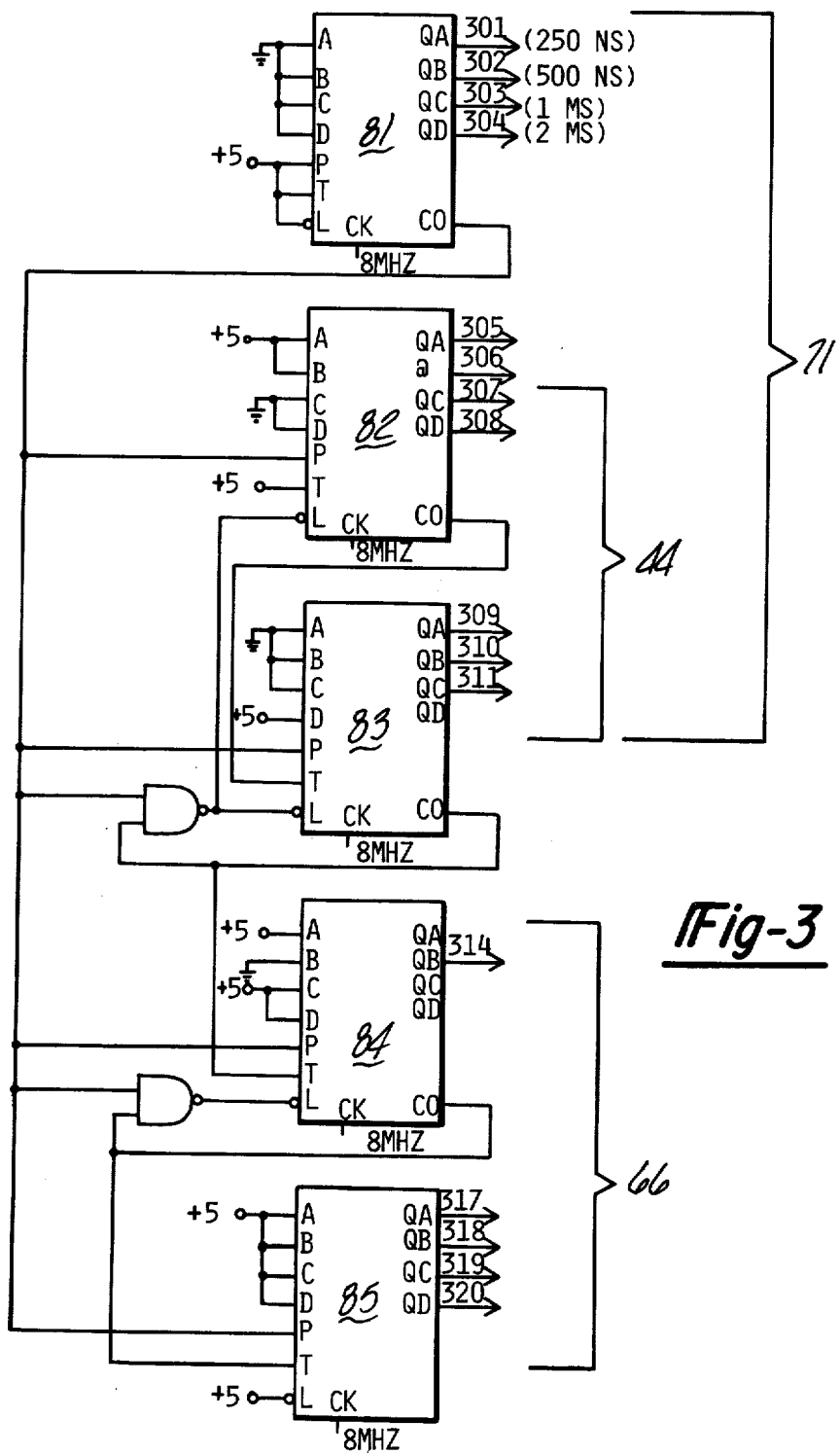
FIG. 3 shows a more detailed implementation for the real time counter block of FIG. 2.

FIG. 3 shows an implementation that may be used to provide the real time counter block 41 of FIG. 2. Such implementation may be provided by five synchronous counters, such as SN74161, suitably cascaded together as shown.

Counters 81, 82 and 83 count 2,000 clock pulses in a cyclic redundant manner to provide a fundamental frequency of 4 KHz. They provide an 11 bit parallel output 301 through 311 with 311 being the most significant of the 11 bits. Briefly, counters 83, 82 and 81 are preset to 830 (hexadecimal), count 1,999 counts to FFF (hexadecimal), and then are preset again to 830 (hexadecimal) by count 2,000 in a cyclically redundant manner. The outputs 301 through 311 provide the 11 bit current time data for path 71. The outputs 307 through 311 provide the 5 bits of address data for path 44.

Counter 84 provides a divide by 3 function and counter 85 provides a divide by 16 function. Counter 84 is preset to D (13 hexadecimal), counts 2 carries out of counter 83 and presets itself on the third carry out of counter 83 such that the output on 314 has a nonsymmetrical period of 750 microseconds. Counter 85 provides a divide by 16 such that the outputs 317, 318, 319 and 320 have symmetrical periods of 1.5, 3, 6 and 12 milliseconds respectively. Outputs 314 and 317 through 320 provide the multiplexer addressing for path 66.

Figure 4:
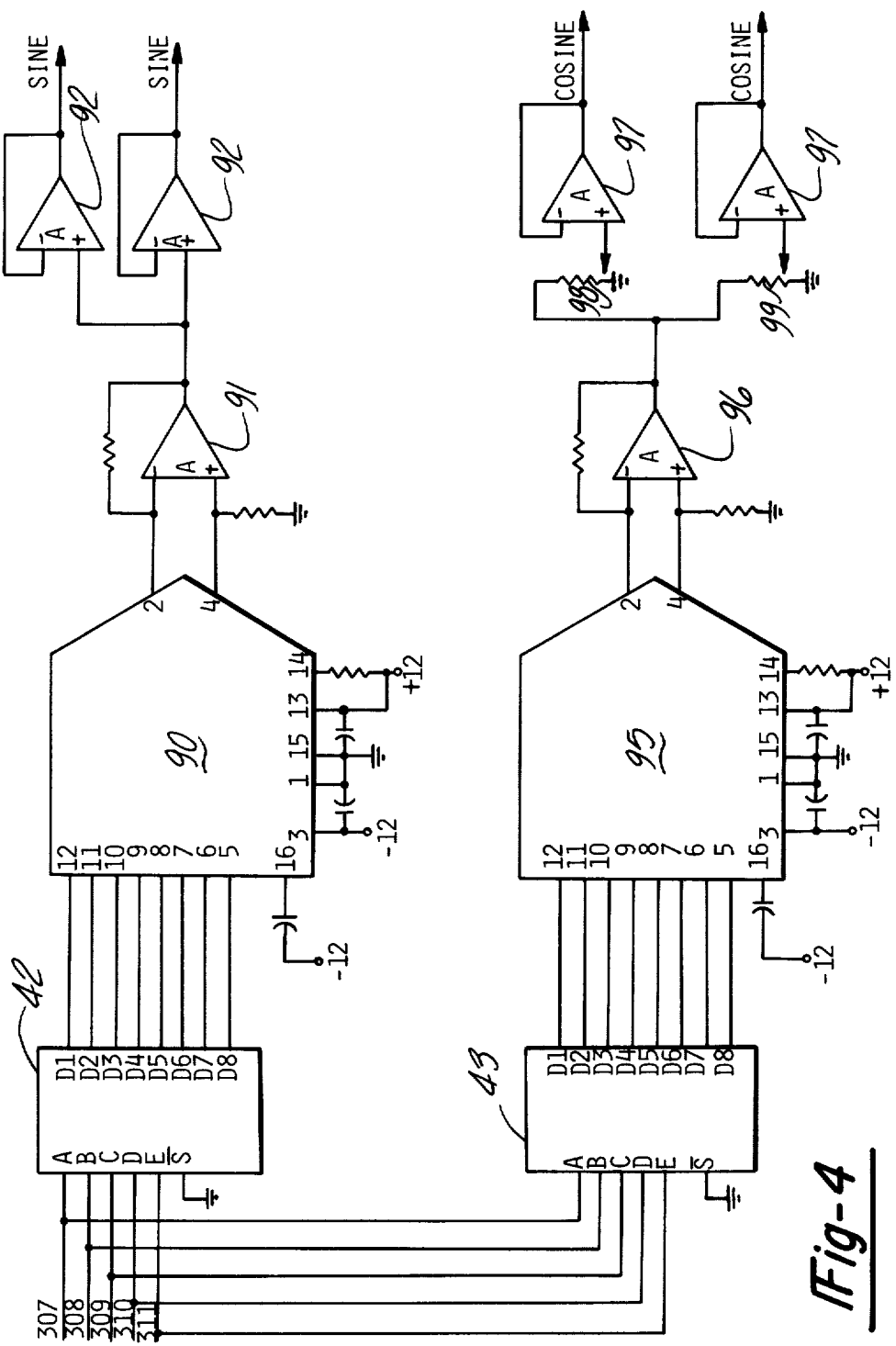
FIG. 4 shows a more detailed implementation for the PROM and digital to analog converter blocks of FIG. 2.

FIG. 4 shows an implementation that may be used to provide the sine prom block 42, sine digital to analog converter block 46, cosine prom block 43 and cosine digital to analog converter block 49 of FIG. 2.

Sine prom 42 is addressed by real time counter outputs 307 through 311. These outputs are the 5 most significant bits of the 11 bit cyclically redundant fundamental frequency output. In response thereto, prom 42 cyclically provides a sequence of 32 (8 bits parallel) data words which represent a sinusoidal waveform. The sine prom is in effect a digital lookup table sequenced by the real time counter. The magnitudes of the sequence of 32 data words approximate the magnitude of a sine wave over one cycle of the fundamental frequency.

Cosine prom 43 is also addressed by the 5 most significant bits of the 11 bit cyclically redundant fundamental frequency output. In response thereto, prom 43 cyclically provides a sequence of 32 (8 bits parallel) data words which represent a sinusoidal waveform, with the sequence of digital data words from proms 42 and 43 representing quadrature (90 degree phase shifted) sinusoidal waveforms. Proms 42 and 43 provide the memory means of the preferred embodiment.

The 8 bit parallel output of sine prom 42 is input to a first digital to analog converter. The first digital to analog converter is formed by a ladder network 90, a current to voltage amplifier 91 and buffer amplifiers such as 92. The 8 bit parallel input from prom 42 is input to a ladder type monolithic digital to current converter 90 which may be a Precision Monolithic Co. DAC-08CQ. The output of digital to current converter 90 is input to the current to voltage amplifier 91 which may be provided by an amplifier model 747. The resistors surrounding the latter two components are selected to provide a 15 volt peak to peak output from amplifier 91. Amplifiers 92 are unity gain buffer amplifiers which may also be provided by amplifier model 747. Actually, there are four unity gain buffer amplifiers, one for exciting the first stator winding of each of the resolvers 31 through 34. The integrated circuit components 90, 91 and 92 together with their associated resistors and capacitors form a first digital to analog converter means which outputs an approximately sinusoidal waveform.

The 8 bit parallel output of cosine prom 43 is input to a second digital to analog converter formed by components 95, 96 and 97 in a manner similar to the first digital to analog converter. However, this converter differs from the previous one in that the resistors associated with amplifier 96 are 10% larger such that amplifier 96 provides approximately 16.5 volts peak to peak output. The potentiometers 98 and 99 on the input of amplifiers 97 are then used to decrease this value and properly "balance" the sine and cosine outputs on a per resolver basis. This one potentiometer per resolver axis is the only calibration adjustment required in the present invention. The integrated circuit components 95, 96 and 97 together with their associated resistors and capacitors form a second digital to analog converter means which outputs an approximately sinusoidal waveform, with the outputs of the first and second digital to analog converter means having a quadrature relationship.

Figure 5:
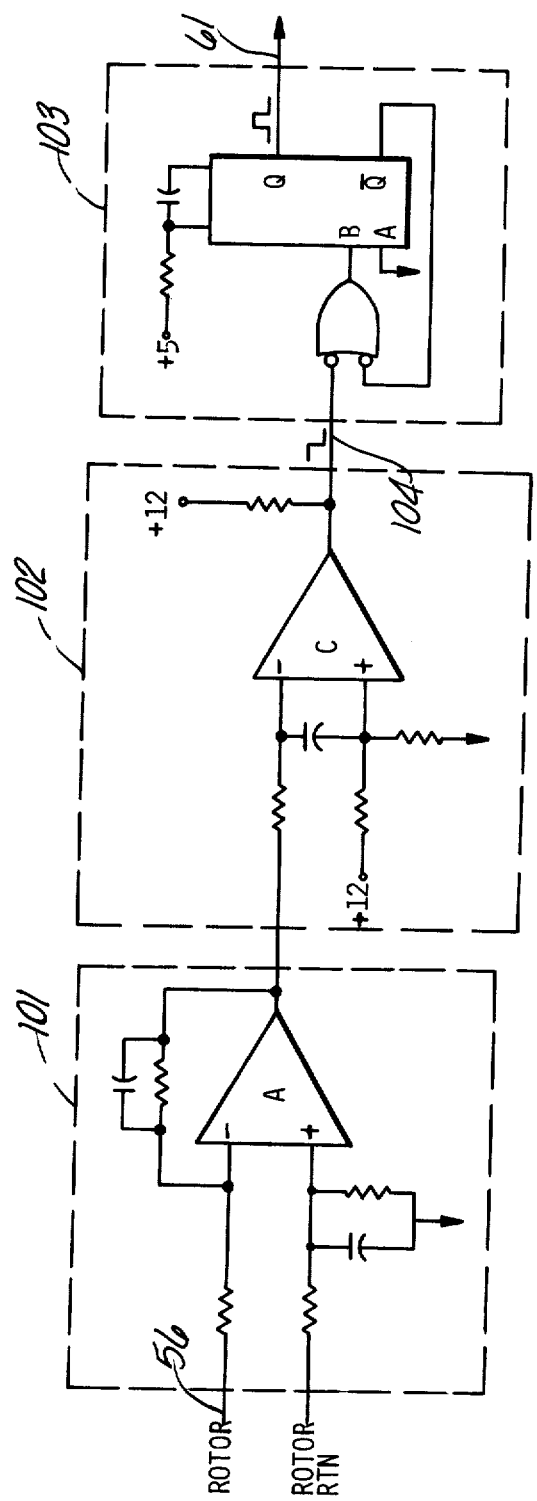
FIG. 5 shows a more detailed implementation for the phase detector blocks of FIG. 2.

FIG. 5 shows an implementation that may be used to provide each of the phase detector blocks 51 through 54. The implementation includes a buffer amplifier 101, an approximate zero crossing detector 102 and a lock-out circuit 103.

Buffer amplifier 101 may receive the rotor waveform on conductor 56 (referenced to ROTOR RTN) and have a DC gain of two-thirds and a 3 db time constant lag of 20 microseconds. The 20 microsecond time constant provides a smoothing function at a frequency that is significantly above the 4 KHz fundamental frequency of the induced rotor voltage. The amplifier integrated circuit may be a type 747.

Zero crossing detector 102 receives as its input, the output of buffer amplifier 101. Detector 102 is provided by a comparator circuit whose output on conductor 104 changes from a logical 1 to a logical 0 when the waveform on conductor 56 changes from a positive voltage to a negative voltage. The comparator integrated circuit may be a type LM311. Actually, the comparator is biased to switch at approximately +0.3 volts rather than 0 volts such that an accidental open rotor lead will not trigger it. Also, such trigger level tends to compensate for any delay in amplifier 101.

Lock-out circuit 103 ensures that only one pulse is output on conductor 61 for each fundamental cycle of the induced rotor signal to eliminate the possibility of brief, multiple pulses for a single cycle. First, recall that the period of the fundamental frequency is 250 microseconds. When the signal on conductor 104 changes from a logical 1 to a logical 0, the one-shot in block 103 fires for 150 microseconds to provide a single output pulse on conductor 61, thus ensuring that another approximate zero crossing can not be indicated on conductor 61 during that time period. Circuit 103 thus locks out any additional outputs which might occur due to a noisy rotor signal on conductor 56. The circuitry of FIG. 5 forms the phase detecting means of the preferred embodiment.

Figure 6:
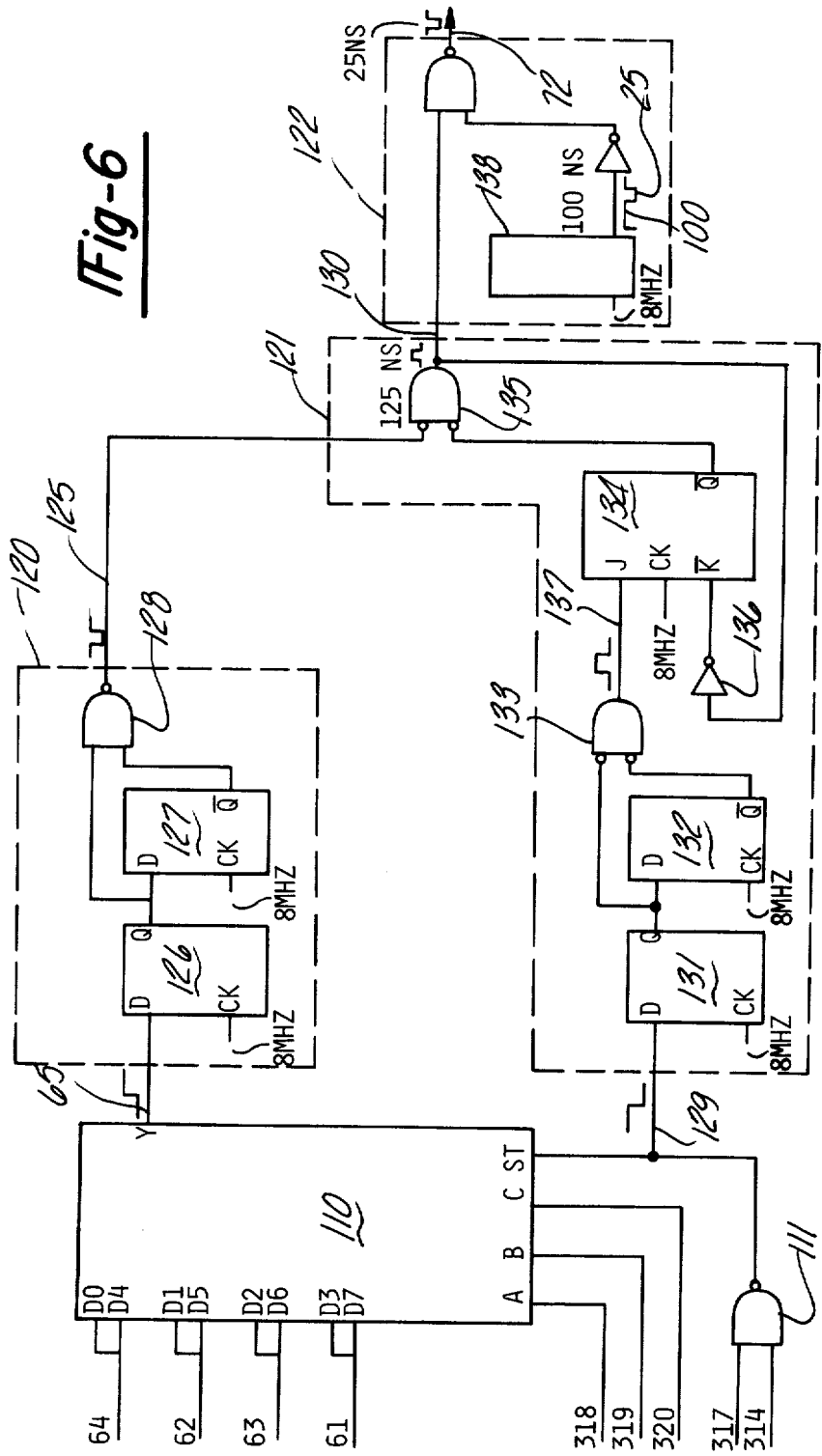
FIG. 6 shows a more detailed implementation for the multiplexer and synchronizer blocks of FIG. 2.

FIG. 6 shows an implementation that may be used to provide the multiplexer block 60 and storage synchronizer block 67 of FIG. 2.

The multiplexer block 60 may be provided by a multiplexer integrated circuit 110 such as an S/N 74151, and a Nand gate 111. The data inputs to the multiplexer 110 are the asynchronous outputs of the phase detectors 51 through 54 on conductors 61 through 64. The selection inputs to the multiplexer 110 are the outputs 318 through 320 of the real time counter which respectively have symmetrical periods of 3, 6 and 12 milliseconds. The strobe input to the multiplexer is provided by Nand gate 111. Gate 111 receives as its inputs 314 and 317. Gate 111 provides at its output a strobe signal that has a period of 1.5 milliseconds and a logic 0 level for 0.5 milleseconds. Thus, the multiplexer 110, in response to its data selection and strobe inputs provides data from a different one of the inputs 61 through 64 at the output on conductor 65 every 1.5 milliseconds. In other words, a 12 millesecond period, data from a given phase detector is placed onto conductor 65 twice (for 0.5 milliseconds each time) at 6 millisecond intervals. The data placed onto conductor 65 by multiplexer 110 is asynchronous to the 8 MHz clock and may include an extra leading edge that can occur each time the multiplexer strobe is enabled.

The storage synchronizer block 67 may be provided by synchronizer 120, single pulse circuit 121 and pulse shortening circuit 122.

Synchronizer 120, in response to a change to a logical 1 level on conductor 65, outputs a single negative going pulse on conductor 125. Such pulse on conductor 125 is synchronous with the 8 MHz clock and is 125 Nsec wide. Briefly, synchronizer 120 is provided by two cascaded type D flip-flops (such as S/N 74175) 126 and 127 (that are clocked by the 8 MHz clock) together with Nand gate 128. The output pulse on conductor 125 starts when flip-flop 126 changes state and ends when flip-flop 127 changes state. Thus, when conductor 65 changes to a logical 1, synchronizer 120 outputs on conductor 125 a single negative-going pulse that is synchronized to the 8 MHz clock and 125 Nsec wide.

Single pulse circuit 121 is responsive to pulses on conductor 125 and the level change on conductor 129 to provide a single pulse on conductor 130. Circuit 121 provides 2 basic functions. First, it selects phase detector leading edges coming from the multiplexer 110; and second, it permits only one pulse (corresponding to a phase detector leading edge) to be placed onto conductor 130 every 1.5 milliseconds.

Circuit 121 includes type D flip-flops (such as S/N 74175) 131 and 132, a Nor gate 133, a J-K flip-flop (such as S/N 74109) 134, a Nor gate 135 and an inverter 136. Briefly, when conductor 129 changes to a logic 0 level, the strobe of multiplexer 110 is enabled. Cascaded type D flip-flops 131 and 132 and gate 133 respond to such change on conductor 129 to provide a single positive-going pulse on conductor 137 which pulse is synchronous to the 8 MHz clock and 125 Nsec wide. The pulse on conductor 137 is input to the J input of flip-flop 134 such that 1 clock cycle later flip-flop 134 is set and enables gate 135 to pass pulses. Thus, if in response to conductor 129 becoming a logical 0, an extraneous rising edge is created on conductor 65; then, conductors 125 and 137 will simultaneously contain pulses, but, the pulse on conductor 125 will have ended before flip-flop 134 enables gate 135. Thus, circuit 121 rejects extraneous multiplexer produced pulses on conductor 65 and selects actual phase detector leading edges on conductor 65.

Circuit 121 also permits only one pulse (corresponding to a phase detector leading edge) to be placed onto conductor 130 each 1.5 milliseconds. As previously stated, after the strobe is enabled by conductor 129 becoming a logical 0, flip-flop 134 enables gate 135 to pass pulses from conductor 125. The first pulse passing through gate 135, however, is fed back to the K input of flip-flop 134 such that the flip-flop synchronously changes state to disable gate 135 after the first pulse passes through gate 135. Thus, every 1.5 milliseconds, a single synchronous pulse is produced on conductor 130 and such pulse corresponds to the output of a selected one of the phase detectors.

Pulse shortening circuit 122 strips the first 100 Nsec off the 125 Nsec pulse on conductor 130 such that the pulse on conductor 72 is not only synchronous with the real time counter, but also occurs when the real time counter output is stable. Circuit 122 utilizes a 100 Nsec delay circuit 138 that is triggered by the 8 MHz clock in providing this function.

Thus, in response to a phase detector output being selected, a single 25 Nsec pulse occurs on conductor 72 in response to the output of the selected phase detector appropriately changing state. This single pulse is synchronous to the real time counter and occurs when the data output of the real time counter is stable.

FIG. 7 shows an implementation that may be used to provide the storage block 70 of FIG. 2. The storage block may be provided by three multiregister integrated circuits 150, 151 and 152 and a register selection circuit 153 (such as S/N 74161).

Each of the register chips 150, 151 and 152 may be a S/N 74S189. Each such register chip contains at least 8 (4 bit) registers with register selection being made by the A, B, C selector inputs. When a pulse occurs on conductor 72, the data on conductors 301 through 311 is stored in an appropriate portion of chips 150, 151 and 152 based on the data selection provided by chip 153. As previously stated, eight such pulses occur on conductor 72 every 12 milliseconds. The A, B, C selection lines also select stored data to be transferred to the data outputs which outputs are represented by arrows 73.

Circuit 153 provides the A, B, C selection inputs for chips 150, 151 and 152. Circuit 153 operates in a first mode for storing data from the real time counter into the chips; and in a second mode for reading data out of the chips.

First, during data storage, conductor 154 contains a logical 0 such that counter 153 merely passes its data inputs through to its data outputs. Recalling that conductors 318, 319 and 320 respectively contain symmetrical square waves having periods of 3, 6 and 12 milliseconds; over a 12 millisecond period, 8 different registers are selected at 1.5 millisecond intervals and during each interval one pulse is received on conductor 72 to store data.

After the data is stored, conductor 154 can be changed to a digital 1 to enable counter 153 to a count mode. By applying pulses to conductor 155, the counter can be stepped through 8 counts such that the 8 stored (11 bit) words are selectively available at the storage output. Conductors 154 and 155 can be under control of the computer processor 10 such that the processor can read the stored data from the registers every 12 milliseconds. The computer can be alerted that data is available every 12 milliseconds by an interrupt if desired.

The storage block 70, provided by the integrated circuits 150 through 153, stores the data on conductors 301 through 311 when a pulse occurs on conductor 72. Such stored data represents the rotative position of a resolver rotor and the position of the corresponding movable member that such rotor is operatively connected to.

What is claimed is:

1. An absolute resolver position measuring device for a numerical control apparatus that controls a machine having at least one movable member wherein a resolver is operatively connected to the movable member such that the rotor of the resolver rotates as the member moves, comprising:

real time counter means for counting real time and for providing a multi-digit digital data word that is cyclically redundant;

memory means addressable by said real time counter means, said memory means for cyclically providing sequences of digital data words which digital data words represent quadrature sinusoidal waveforms;

first digital to analog converter means responsive to digital data words from said memory means for providing an approximately sinusoidal waveform to energize a first stator winding of said resolver;

second digital to analog converter means responsive to digital data words from said memory means for providing an approximately sinusoidal waveform to energize a second stator winding of said resolver, the sinusoidal outputs of said first and second digital to analog converter means being in a quadrature relationship;

phase detecting means responsive to the waveform from the rotor of said resolver for indicating when the waveform provided by said resolver rotor reaches a predetermined phase relationship; and storage means for storing the output of said real time counter means in response to the output indicative of said phase detecting means such that the contents of said storage means represents the position of the rotor and the movable member.

2. The measuring device according to claim 1 wherein said memory means comprises first and second Programmable Read Only Memories, each of which are addressable by said cyclically redundant real time counter means.

3. The measuring device according to claim 2 wherein said first and second digital to analog converter means are each provided by a resistive ladder network and an operational amplifier.

4. The measuring device according to claims 1, 2 or 3 wherein said real time counter means provides address signals cyclically at a frequency greater than one kilohertz.

5. The measuring device according to claim 1 wherein said storage means includes synchronizing means for synchronizing the output indication of the phase detecting means to the real time counter means.

6. The measuring device according to claim 5 wherein said phase detecting means approximately detects the zero crossing of the rotor output waveform.

7. The measuring device according to claim 5 wherein said phase detecting means comprises:

an amplifier circuit that receives as an input the waveform provided by the rotor of the resolver, said amplifier circuit having a lagging time constant that filters the waveform at a frequency significantly greater than the fundamental frequency of stator excitation;

a comparator circuit that receives as an input the output of said amplifier circuit, said comparator circuit output changing states at approximately the zero crossing of its input; and a single pulse circuit that receives as an input the output of said comparator circuit, said single pulse circuit providing one and only one output indication for each cycle of stator excitation.

8. An absolute resolver position measuring device for a numerical control apparatus that controls a machine having a plurality of movable members wherein a resolver is operatively connected to each of said controlled movable members such that the rotor of each said resolver rotates as the corresponding member moves, comprising:

real time counter means for counting real time and for providing a multi-digit digital data word that is cyclically redundant;

memory means addressable by said real time counter means, said memory means for cyclically providing sequences of digital data words which digital data words represent quadrature sinusoidal waveforms at a fundamental frequency;

first digital to analog converter means responsive to digital data words from said memory means for providing an approximately sinusoidal waveform at the fundamental frequency to energize a first stator winding of each of said resolvers;

second digital to analog converter means responsive to digital data words from said memory means for providing an approximately sinusoidal waveform at the fundamental frequency to energize a second stator winding of each of said resolvers, the sinusoidal outputs of said first and second digital to analog converter means being in a quadrature relationship;

a plurality of phase detecting means, each of said phase detecting means being responsive to the waveform from one of said resolver rotors for indicating when the waveform provided by said resolver rotor reaches a predetermined phase relationship;

multiplexing means responsive to said plurality of phase detecting means and said real time counter means for providing an output, said multiplexing means output representing a selected sequence of phase detecting means outputs with such selected sequence being based on selection signal from said real time counter means; and storage means for sequentially storing the output of said real time counter means in response to the selected sequence from said multiplexing means and selection signals from said real time counter means such that the contents of said storage means represents the positions of each selected rotor and corresponding movable member.

9. The measuring device according to claim 8 wherein said memory means comprises first and second Programmable Read Only Memories, each of which are addressable by said cyclically redundant real time counter means.

10. The measuring device according to claim 9 wherein said first and second digital to analog converter means are each provided by a resistive ladder network and an operational amplifier.

11. The measuring device according to claim 8 wherein said storage means includes synchronizing means for synchronizing the output indication of the multiplexing means to the real time counter means.

12. The measuring device according to claim 11 wherein said synchronizing means includes a true leading edge detector circuit and a one pulse lock-out circuit.

13. The measuring device according to claim 11 wherein each said phase detecting means approximately detects the zero crossing of the rotor output waveform.

14. The measuring device according to claim 11 wherein each said phase detecting means comprises:
an amplifier circuit that receives as an input the waveform provided by the rotor of the resolver, said amplifier circuit having a lagging time constant that filters the waveform at a frequency significantly greater than the fundamental frequency of stator excitation;
a comparator circuit that receives as an input the output of said amplifier circuit, said comparator circuit output changing states at approximately the zero crossing of its input; and
a single pulse circuit that receives as an input the output of said comparator circuit, said single pulse circuit providing one and only one output indication for each cycle of stator excitation.

* * * * *